United States Patent [19]

Noda et al.

[11] Patent Number: 4,811,353

[45] Date of Patent: Mar. 7, 1989

[54] SEMICONDUCTOR OPTICAL MODULATOR

[75] Inventors: Yukio Noda; Masatoshi Suzuki; Yukitoshi Kushiro; Shigeyuki Akiba, all of Tokyo, Japan

[73] Assignee: Kokusai Denshin Denwa Kabushiki Kaisha, Tokyo, Japan

[21] Appl. No.: 15,954

[22] Filed: Feb. 18, 1987

[30] Foreign Application Priority Data

Feb. 21, 1986 [JP] Japan .................................. 61-35096

[51] Int. Cl.[4] ............................. H01S 3/19; H01S 3/10
[52] U.S. Cl. ......................................... 372/45; 372/26; 372/46; 372/50; 372/96
[58] Field of Search ........................ 372/26, 44, 45, 46, 372/50, 96

[56] References Cited

U.S. PATENT DOCUMENTS 4,720,835  1/1988  Akiba et al. ........................... 372/96

FOREIGN PATENT DOCUMENTS 72283    4/1985  Japan .................................... 372/46
2105101  3/1983  United Kingdom ................. 372/50

Primary Examiner—William L. Sikes
Assistant Examiner—Georgia Y. Epps
Attorney, Agent, or Firm—Emmanuel J. Lobato; Robert E. Burns

[57] ABSTRACT

A semiconductor optical modulator is disclosed which is capable of high-speed modulation without the necessity of increasing the modulating voltage. The present invention has its feature in that the carrier density of the clad layer adjoining the optical waveguide layer 3 is gradually raised toward the p-n junction or Schottky junction, thereby increasing the width of the depletion layer to decrease the junction capacitance.

12 Claims, 3 Drawing Sheets

SEMICONDUCTOR OPTICAL MODULATOR

BACKGROUND OF THE INVENTION

The present invention relates to a semiconductor optical modulator, and more particularly to improvement of the modulation speed thereof.

Semiconductor optical modulators for optical data processing and optical communication use are now being developed very actively. Among them, a voltage-driven semiconductor optical modulator of extremely high response speed which utilizes the electrooptic effect or electro-absorption effect is attracting attention as a high-speed modulator.

In this case, there has been a strong demand for a semiconductor optical modulator which is capable of high-speed modulation without the necessity of raising the modulating voltage, but no satisfactory proposals have been made up to now.

SUMMARY OF THE INVENTION

An object of the present invention is to provide a semiconductor optical modulator which is capable of high-speed modulation without the necessity of increasing the modulating voltage.

The present invention has its feature in that the carrier density of the clad layer adjoining the optical waveguide layer is gradually raised toward the p-n junction or Schottky junction, thereby increasing the width of the depletion layer to decrease the junction capacitance.

BRIEF DESCRIPTION OF THE DRAWING

The present invention will be described in detail below in comparison with prior art with reference to accompanying drawings, in which.

DETAILED DESCRIPTION

To make differences between prior art and the present invention clear, prior art will first be described.

Figure 1:
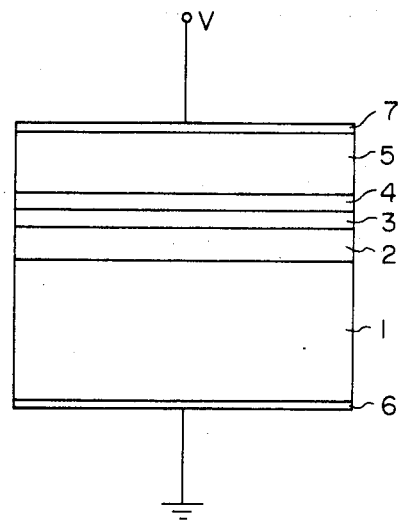
FIG. 1 is a cross-sectional view of a conventional voltage-driven semiconductor optical modulator.

FIG. 1 is a cross-sectional view of a conventional voltage-driven semiconductor optical modulator. Reference numeral 1 indicates an n+-type InP substrate, 2 an n-type InP lower clad layer, 3 an n⁻-type GaInAsP optical waveguide layer, 4 an n⁻-type InP upper clad layer, 5 a p+-type InP layer, 6 an n-side electrode, and 7 a p-side electrode.

With this structure, a reverse voltage (V) is applied across the electrodes 6 and 7 to increase the electric field intensity in the optical waveguide layer 3, and modulation is performed through utilization of variations in its refractive index by the electrooptic effect or in its absorption coefficient by the electro-absorption effect. The depth of modulation is dependent upon the amount of variation in the refractive index or absorption coefficient which is caused in accordance with the electric field intensity in the optical waveguide layer 3 which is produced by the application of the reverse voltage.

Figure 2:
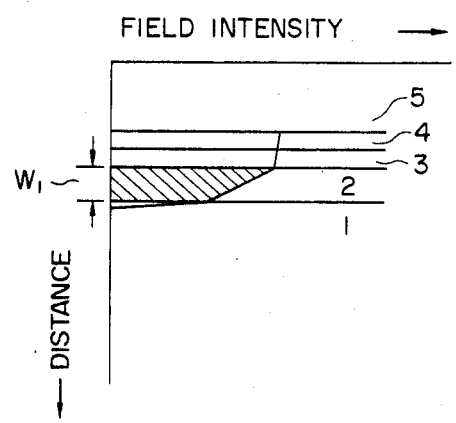
FIG. 2 is a diagram showing the distribution of electric field intensity of the conventional semiconductor optical modulator.

FIG. 2 shows the electric field intensity distribution in the respective layers, obtained when the reverse voltage was applied to the conventional semiconductor optical modulator depicted in FIG. 1. The electric field intensity is the highest between the p-type InP layer 5 and then the n⁻-type InP upper clad layer 4 which define therebetween a p-n junction, and the field intensity diminishes as the distance from the p-n junction increases. The ordinate represents the distance from the p-n junction to each layer, and the width $W_1$ of the lower clad layer 2 exposed to the electric field means the width of a depletion layer in the lower clad layer 2.

For faster modulation by such a conventional voltage-driven semiconductor optical modulator, it is necessary to increase the thickness of the lower clad layer 2 and raise the reverse voltage (hereinafter referred to as a "modulating voltage") which is applied across the electrodes 6 and 7. However, the voltage driving of the modulator is difficult since a high modulating voltage cannot easily be created with a high-speed pulse generator now available.

For the reason given above, there has been a strong demand for a semiconductor optical modulator which is capable of high-speed modulation without the necessity of raising the modulating voltage, but no satisfactory proposals have been made up to now.

The present invention will hereinafter described in detail.

It is known, in general, to reduce the p-n junction capacitance for high-speed modulation without changing the modulating voltage. Based upon this, the present inventors considered that the relationship between the p-n junction capacitance C and the width W of the depletion layer adjacent the optical waveguide layer 3 could be expressed approximately by the following equation:

$$C = \epsilon_o \epsilon / W \qquad (1)$$

where $\epsilon_0$ is the dielectric constant of vacuum and $\epsilon$ is relative dielectric constant of the optical waveguide layer 3. As is evident from Eq. (1), the p-n junction capacitance C is in inverse proportion to the depletion layer width W of the clad layer. Accordingly, an increase in the depletion layer width W of the clad layer without changing the electric field intensity in the optical waveguide layer 3 will reduce the p-n junction capacitance, enabling the high-speed modulation. For this reason, according to the present invention, the carrier density in the clad layer is varied to thereby change the electric field intensity distribution in the clad layer so that the depletion layer width is increased, providing for reduced p-n junction capacitance.

In the following description, the parts corresponding to those in the prior art example are identified by the same reference numerals and no description will be given of them.

Figure 3:
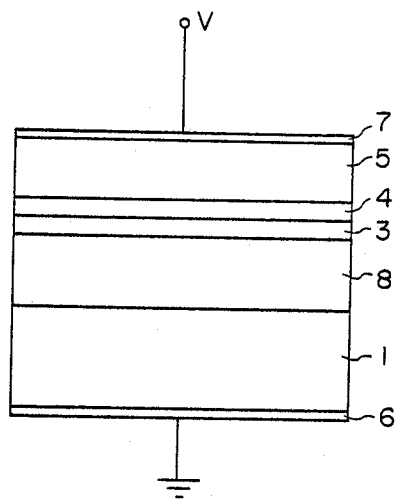
FIG. 3 is a cross-sectional view of the semiconductor optical modulator of the present invention.

FIG. 3 illustrates, in cross section, a voltage-driven semiconductor optical modulator embodying the present invention. This embodiment differs from the conventional structure of FIG. 1 in that the n-type InP lower clad layer 2 of a fixed carrier density is substituted by an n-type InP lower clad layer 8 of varying carrier densities. The lower clad layer 8 is formed so that its carrier density increases toward the optical waveguide layer 3. With such a gradient of the carrier density in the lower clad layer 8, even if the clad layer 8 is formed thicker without increasing the modulating voltage, the electric field is applied to the lower clad layer 8 throughout, ensuring an increase in the width W of the depletion layer. Since the p-n junction capacitance diminishes in inverse proportion to the width W of the depletion layer, as referred to previously in connection with Eq. (1), high-speed modulation can be achieved without the necessity of increasing the reverse voltage.

Figure 4:
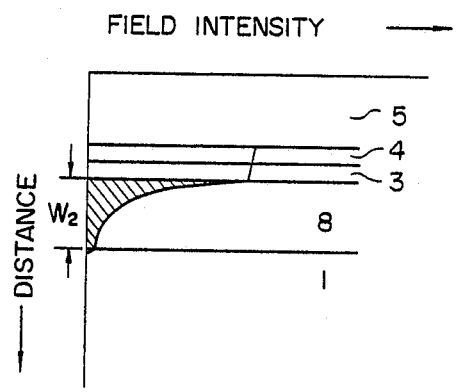
FIG. 4 is a diagram showing the distribution of electric field intensity of the semiconductor optical modulator of the present invention.

FIG. 4 is diagram showing the distribution of the electric field intensity in the semiconductor optical modulator of the present invention. With a view to comparison with the prior art, in the measurement of this field intensity distribution, the carrier density of the lower clad layer 8 was varied substantially continuously from, for example, $10^{14}$ cm$^{-3}$ on the side of the substrate 1 to $5 \times 10^{15}$ cm$^{-3}$ on the side of the optical waveguide layer 3, by the same modulating voltage (9 v) as was used for measuring the field intensity shown in FIG. 2, and the thickness of the lower clad layer was changed from around 0.5 μm in the prior art to around 1.4 μm in the present invention.

FIG. 4 reveals the following facts:

(1) Since the modulating voltage used is equal to that in the prior art, the field intensity value of the optical waveguide layer 3 does not change either. That is, the depth of modulation remains unchanged.

(2) The slope of the field intensity distribution is steep on the side of the optical waveguide layer 3 where the carrier density is high, but is gentle on the side where the carrier density is low; namely, the distance over which the electric field extends (the distance from the plane of the p-n junction) can be increased with a change in the carrier density. Accordingly, an increase in the distance over which the electric field extends means that the width of the depletion layer can also be increased.

(3) The hatched region in the clad layer 2 of the conventional structure and the hatched region in the clad layer 8 of this invention structure have the same area. This means that the modulating voltage is the same. Accordingly, this also indicates that the width of the depletion layer increases although the modulating voltage remains unchanged.

Incidentally, the difference $W_0$ in the width of the depletion layer between the conventional structure and this invention structure results from the difference in thickness between their clad layers. Since the InP lower clad layer is 1.4 μm in thickness, the modulation band width can be selected around 20 GHz.

As described above, the present invention permits speedup of modulation without increasing the modulating voltage. While in the above the present invention has been described in connection with a case where the carrier density is continuously varied in the single-layered lower clad layer 8, it is also possible to form the lower clad layer 8 of discrete carrier density by laminating a plurality of layers of different carrier densities in the order of carrier density. Moreover, when the lower clad layer is formed thicker, it is necessary only to increase the carrier density. In the above the semiconductor layers are described to be formed of materials of the InP/GaAsP series, but the present invention is not limited specifically thereto but is applicable to semiconductor layers of other materials.

Next, a description will be given of an example of application of the semiconductor optical modulator of the present invention.

Figure 5:
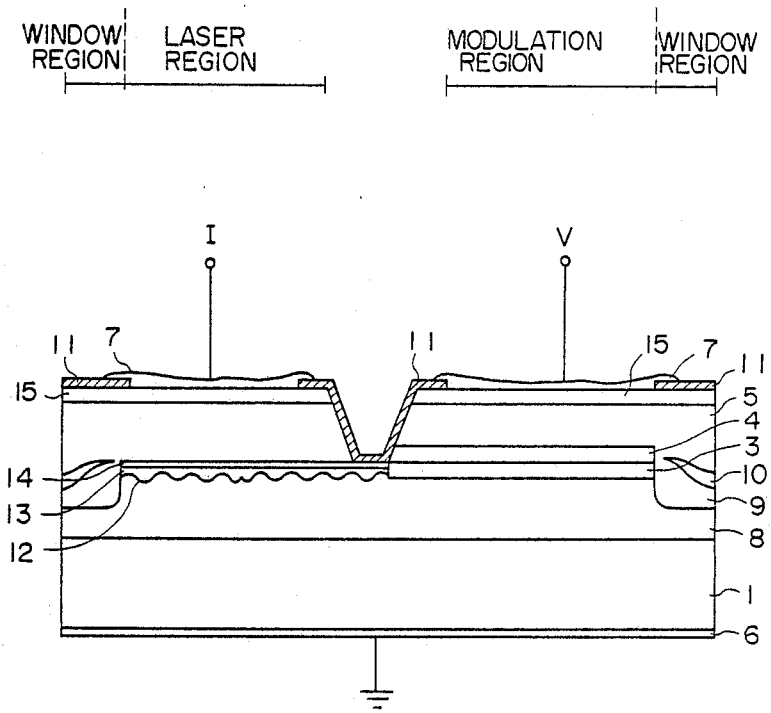
FIG. 5 is a cross-sectional view of a high-speed optical signal source device embodying the present invention.

FIG. 5 illustrates, in cross section, an example of application of the present invention to a high-speed optical signal source device which is a monolithic integration of a distributed feedback semiconductor laser (hereinafter referred to as a "DFB laser") and the semiconductor optical modulator.

In FIG. 5, a laser region has a structure in which an InP clad layer 8 having periodic corrugations, a $Ga_xIn_{1-x}As_yP_{1-y}$ laser-region optical waveguide layer 13, a $Ga_rIn_{1-r}As_sP_{1-s}$ active layer 14, and a $Ga_tIn_{1-t}As_uP_{1-u}$ contact layer 15 are laminated on the InP substrate 1 in that order. Reference numeral 11 indicates an $Si_3N_4$ insulating film and 12 a $\leq/4$ shift-diffraction grating. The composition fractions of the above layers are $0 \leq x, y, r, s, t, u \leq 1$, and the energy gaps of the optical waveguide layer 13 and the contact layer 15 are larger than the energy gap of the active layer 14. A p-type InP layer 9 and an n-type InP layer 10 constitute a window region for eliminating reflection at the end face of the laser region.

On the other hand, a modulating region has a structure in which an InP clad layer 8 of varying carrier densitites, a $Ga_xIn_{1-x}As_yP_{1-y}$ modulating-region optical waveguide layer 3 of a thickness including the optical waveguide layer 13 and the active layer 14 of the laser region, the InP upper clad layer 4, the InP clad layer 5, and the $Ga_tIn_{1-t}As_uP_{1-u}$ contact layer 15 are laminated on the substrate 1 common to the laser region in that order and the $Si_3N_4$ insulating film 11 and a window region are added, producing the electroabsorption effect. Reference numerals 6 and 7 identify electrodes.

Light lasing stably at a single wavelength in the laser region is guided by the modulating-region optical waveguide layer 3 connected directly to the optical waveguide of the laser region and is modulated in its intensity by a modulating voltage which is applied across the electrodes 6 and 7 of the modulating region. Since the lower clad layer 8 is formed so that its carrier density increases as the optical guide layer 3 is approached from the side of the substrate 1, the p-n junction capacitance is reduced. Thus high-speed modulation can be achieved with a high extinction ratio and a low modulating voltage.

As described above, according to the present invention, the carrier density of the lower clad layer 8 adjoining the optical waveguide layer 3 is varied, by which the width of the depletion layer is increased to reduce the p-n junction capacitance, permitting high-speed modulation with a low modulating voltage. Therefore, the present invention can be applied to the semiconductor optical modulator for optical communications or optical data processing, and hence is of great utility when put to practical use.

What we claim is:

1. In a semiconductor optical modulator having a substrate, a clad layer having a carrier density gradient and composed of at least one layer formed on the substrate, an optical waveguide layer on the clad layer for controlling light, semiconductor means for defining a p-n junction, said means being disposed on the optical waveguide layer, and the clad layer having a carrier density gradually decreasing as distance away from the optical waveguide toward the substrate increases.

2. In a semiconductor optical modulator according to claim 1, in which the carrier density of the clad layer continuously decreases progressively as said distance increases.

3. In a semiconductor optical modulator according to claim 1, in which the carrier density of the clad layer discretely decreases.

4. In a semiconductor optical optical modulator according to claim 1, in which the carrier density of the clad layer decreases from $10^{14}$cm$^{-3}$ to $5\times10^{15}$cm$^{-3}$.

5. In a semiconductor optical modulator according to claim 1, in which the thickness of the clad layer is about 1.4 μm.

6. In a semiconductor optical modulator according to claim 1, including a distributed feedback semiconductor laser formed therewith in a monolithic integration therewith, and the substrate and clad layer are common to the semiconductor optical modulator and the distributed feedback semiconductor laser.

7. In a semiconductor optical modulator having a substrate, a clad layer having a carrier density gradient and composed of at least one layer formed on the substrate, an optical waveguide layer on the clad layer for controlling light, means for defining a Schottky junction, said means being disposed on the optical waveguide layer, and the clad layer having a carrier density gradually decreasing as distance away from the optical waveguide toward the substrate increases.

8. In a semiconductor optical modulator according to claim 7, in the carrier density of the clad layer continuously decreases progressively as said distance increases.

9. In a semiconductor optical modulator according to claim 7, in which the carrier density of the clad layer discretely decreases.

10. In a semiconductor optical modulator according to claim 7, in which the carrier density of the clad layer decreases from $10^{14}$ cm$^{-3}$ to $5\times10^{15}$ cm$^{-3}$.

11. In a semiconductor optical modulator according to claim 7, in which the thickness of the clad layer is about 1.4 μm.

12. In a semiconductor optical modulator according to claim 7, including a distributed feedback semiconductor laser formed therewith in a monolithic integration therewith, and the substrate and clad layer are common to the semiconductor optical modulator and the distributed feedback semiconductor laser.

* * * * *